(12) United States Patent
Katampe et al.

(10) Patent No.: US 6,620,571 B2
(45) Date of Patent: Sep. 16, 2003

(54) METHOD FOR PRODUCING MICROCAPSULES HAVING IMPROVED WALL CHARACTERISTICS

(75) Inventors: Ibrahim Katampe, Kettering, OH (US); Joseph C. Camillus, Centerville, OH (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/528,035

(22) Filed: Mar. 17, 2000

(65) Prior Publication Data
US 2003/0152860 A1 Aug. 14, 2003

(51) Int. Cl.$^7$ ................................................. G03F 7/09
(52) U.S. Cl. .............. 430/138; 428/402.21; 428/402.22
(58) Field of Search ..................... 430/138; 428/402.21, 428/402.22

(56) References Cited

U.S. PATENT DOCUMENTS

| | | | |
|---|---|---|---|
| 3,672,935 A | 6/1972 | Miller et al. ................ | 117/36.8 |
| 3,796,669 A | 3/1974 | Kiritani et al. ............. | 252/316 |
| 4,025,455 A | 5/1977 | Shackle ....................... | 252/316 |
| 4,089,802 A | 5/1978 | Foris et al. .................. | 252/316 |
| 4,440,846 A | 4/1984 | Sanders et al. ............. | 430/138 |
| 4,551,407 A | 11/1985 | Sanders ...................... | 430/138 |
| 4,586,060 A | 4/1986 | Vassiliades ................. | 346/215 |
| 4,842,980 A | 6/1989 | Gottschalk et al. ......... | 430/138 |
| 4,880,721 A | 11/1989 | Ishikawa ..................... | 430/138 |
| 4,929,531 A * | 5/1990 | Lee et al. .................... | 430/138 |
| 4,962,010 A | 10/1990 | Colyer et al. ............... | 430/138 |
| 4,968,580 A * | 11/1990 | Lee et al. .................... | 430/138 |
| 4,977,059 A * | 12/1990 | Liang et al. ................ | 430/138 |
| 4,977,060 A * | 12/1990 | Liang et al. ................ | 430/138 |
| 5,011,885 A | 4/1991 | Chen et al. ................. | 524/591 |
| 5,112,540 A | 5/1992 | Chen et al. ................. | 264/4.7 |
| 5,120,475 A | 6/1992 | Chen et al. ................. | 264/4.7 |
| 5,283,015 A | 2/1994 | Hutchings et al. .......... | 264/4.7 |
| 5,283,016 A * | 2/1994 | Davis et al. ................ | 264/4.33 |
| 6,030,740 A | 2/2000 | Polykarpov ................. | 430/138 |
| 6,037,094 A | 3/2000 | Katampe et al. | |
| 6,127,084 A | 10/2000 | Katampe et al. | |

FOREIGN PATENT DOCUMENTS

| | | | |
|---|---|---|---|
| EP | 0433094 | 6/1991 | |
| JP | 57120518 A * | 7/1982 | ............ A61K/9/56 |

* cited by examiner

*Primary Examiner*—Janet Baxter
*Assistant Examiner*—Yvette C. Thornton
(74) *Attorney, Agent, or Firm*—Thompson Hine LLP

(57) ABSTRACT

A process for forming microcapsules having substantially impermeable microcapsule walls comprising the steps of: forming an emulsion of an internal phase in a continuous aqueous phase, the internal phase including a photosensitive composition and a polyvalent isocyanate, the continuous aqueous phase including a sulfonated polystyrene, at least one of the internal phase or the continuous aqueous phase further including a hydrophilic polymer; and enwrapping particles of the internal phase in an amine-formaldehyde condensation product produced by in situ condensation of an amine and formaldehyde is disclosed.

14 Claims, No Drawings

METHOD FOR PRODUCING MICROCAPSULES HAVING IMPROVED WALL CHARACTERISTICS

BACKGROUND OF THE INVENTION

The present invention relates to an improved method for producing microcapsules and, more particularly, to a method for producing microcapsules in which the microcapsule walls are substantially impermeable and exhibit improved temperature and humidity stability. While the method of the present invention is useful in producing microcapsules generally, microcapsules prepared in accordance with the present invention are particularly useful in photosensitive imaging materials of the type which employ a layer of microcapsules containing a radiation sensitive composition.

Photohardenable imaging systems employing microencapsulated radiation sensitive compositions are the subject of commonly assigned U.S. Pat. Nos. 4,399,209; 4,416,966; 4,440,846; 4,766,050; 4,962,010 and 5,283,015. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and is encapsulated with a color former. Exposure to actinic radiation hardens the internal phase of the microcapsules. Following exposure, the imaging sheet is subjected to a uniform rupturing force by passing the sheet through the nip between a pair of pressure rollers. An image transfer system in which the developer material is coated on a separate substrate as a separate developer or copy sheet is disclosed in commonly assigned U.S. Pat. No. 4,399,209. A self-contained imaging sheet in which the encapsulated color former and the developer material are co-deposited on one surface of a single substrate as one layer or as two interactive layers is disclosed in commonly assigned U.S. Pat. No. 4,440,846. An imaging system comprising a support, a layer containing microcapsules, a layer of developer material, and a layer containing an opacifying agent is disclosed in commonly assigned U.S. Pat. No. 4,766,050. The opacifying agent can form a separate layer or can be part of the layer containing the microcapsules or both but is interposed between the microcapsules and the developer to hide the microcapsules when viewing the image. Methods for forming amino-formaldehyde microcapsules for use in photosensitive imaging systems are disclosed in U.S. Pat. Nos. 4,962,010 and 5,283,015.

SUMMARY OF THE INVENTION

In accordance with the present invention, microcapsules containing amine-formaldehyde shell walls are prepared by emulsifying an oily material internal phase containing an isocyanate pre-wall former in an aqueous medium and subsequently forming amine-formaldehyde walls around the internal phase by in situ polycondensation. The invention is particularly characterized by adding a hydrophilic polymer into at least one of the internal phase or the continuous aqueous phase. It has been found that when a hydrophilic polymer is present in either the internal phase or the continuous aqueous phase, and microcapsules are formed in an otherwise conventional manner, the hydrophilic polymer becomes incorporated into the microcapsule wall. Microcapsules produced in accordance with the present invention are substantially impermeable and exhibit improved temperature and humidity stability as a result of the hydrophilic polymer in the microcapsule wall. Furthermore, the presence of the hydrophilic polymer in the microcapsule wall provides for microcapsules which retain moisture better and therefore are less likely to dry out upon storage. Microcapsules which have dried out upon storage are more likely to prematurely rupture and cause undesirable discoloration or image darkening with time.

Another embodiment of the present invention resides in the production of microcapsules in which a hydrophilic polymer is used in place of at least a portion of the amount of methylated polygalacturonic acid, typically pectin, in the continuous aqueous phase. Previously, amine-formaldehyde capsules having a desired uniform small size and wall characteristics have been obtained by using a methylated polygalacturonic acid, typical pectin, as a system modifier. However, pectin is a naturally occurring product and therefore its composition and effectiveness as a system modifier can vary depending upon the time and the source from which the pectin is derived. Furthermore, pectin tends to gel in the presence of zinc, thereby creating problems when used in the preparation of microcapsules incorporated into imaging systems utilizing zincated developers. The hydrophilic polymers of the invention, especially synthetic hydrophilic polymers, tend to be more consistent as far as composition and functional properties as compared to the naturally occurring pectin which can vary depending upon the season and the source from which it is derived. Furthermore, substituting a hydrophilic polymer for some or all of the pectin in a conventional system can minimize problems associated with pectin gelling when used with zincated developers.

Moreover, it is hypothesized that by incorporating a hydrophilic polymer into the microcapsule wall, a substantially impermeable barrier is formed around the internal phase which prevents the unwanted migration of volatile components from the developer resin into the encapsulated contents which can cause premature dye development and discoloration. Accordingly, the substantially impermeable capsule walls provide superior results in terms of temperature and humidity stability.

Accordingly, the present invention provides a process for producing microcapsules having substantially impermeable microcapsule walls comprising the steps of: forming an emulsion of an internal phase in a continuous aqueous phase, the internal phase including a photosensitive composition and a polyvalent isocyanate, the continuous aqueous phase including a sulfonated polystyrene and at least one of the internal phase or the continuous aqueous phase further including a hydrophilic polymer; and enwrapping particles of the internal phase in an amine-formaldehyde condensation product produced by in situ condensation of an amine and formaldehyde.

The microcapsules may contain a photohardenable or photosoftenable material as the photosensitive composition. In the most typical case, the capsules contain a polyethylenically unsaturated monomer, a photoinitiator, and a dye precursor. Imaging is conducted as described in the aforementioned commonly assigned patents which are incorporated herein by reference.

DETAILED DESCRIPTION OF THE INVENTION

In accordance with the present invention, an improved method for producing amine-formaldehyde microcapsules is provided. The method includes the steps of forming an emulsion of an internal phase in a continuous aqueous phase and enwrapping the particles of the internal phase in an amine-formaldehyde wall produced by in situ condensation of an amine and formaldehyde. The invention is particularly characterized by the presence of a hydrophilic polymer in at least one of the internal phase or continuous aqueous phase. The presence of the hydrophilic polymer functions to enable the production of microcapsules having improved wall characteristics in terms of impermeability and temperature/humidity stability.

The microcapsules produced in accordance with the present invention preferably are used as photographic materials, and in particular, in microencapsulated imaging systems such as those described in U.S. Pat. Nos. 4,399,209 and 4,440,836. The microcapsules may also be used for a number of different practical applications such as in agricultural chemicals, medicines, perfumes, chemicals, adhesives, liquid crystals, detergents, dyes, dye precursors, developers, catalysts, rust-preventing agents as well as photographic materials.

In one embodiment of the invention, a hydrophilic polymer is incorporated into the internal phase which contains a chromogenic material and a photosensitive composition. The hydrophilic polymer is dissolved or dispersed in the internal phase constituents prior to encapsulation. In order to be incorporated in the internal phase, the hydrophilic polymer should be soluble or dispersible in the internal phase constituents such as the acrylate esters described below. The hydrophilic polymer in the internal phase is believed to "interfere" with the network of the resultant polymer formed from the radical polymerization by trapping moisture into the polymer matrix. This can help increase the rate of diffusion of the dyes (mobile phase) to the developer resin. This is evident by faster "toe" sensitivity compared to systems without these additives. Chemically modified gelatins are particularly desirable for use in the invention because the chemical sites on the modified gelatin improve the hydrophilicity properties of the gelatin, hence more water retention ability, since less hydrophobic sites will be available after modification. The hydrophilic polymer can be added to the internal phase in an amount of about 0.01 to 10% and more typically about 0.15 to 3% based on the monomer and also dependent on the color of the resultant batch.

In another embodiment of the invention, the hydrophilic polymer is added to the continuous aqueous phase. The hydrophilic polymer can be dissolved in the continuous aqueous phase where it functions as a viscosity modifier and wall component. Incorporating the hydrophilic polymer into the continuous aqueous phase provides a process for increased control over the size of the resultant microcapsules. The increased aqueous phase viscosity leads to smaller size average capsules. The hydrophilic polymer also plasticizes the microcapsule wall thereby providing better control of the dye release mechanism. Conventional microcapsule walls typically display hard shell properties, especially under dry conditions, whereby the walls can break relatively easily and lead to uncontrollable dye release.

The amount of hydrophilic polymer added to the continuous aqueous phase will vary with the nature of the hydrophilic polymer and the nature and amount of the other materials used in the composition. The amount should be limited to an amount that does not interfere with capsule rupture and reaction of the color former with the developer. The hydrophilic polymer is preferably incorporated in the aqueous phase in an amount of about 0.01 to 10% based on monomer used in the composition and more typically in an amount of 0.15 to 3%.

The hydrophilic polymers useful in the present invention include synthetic and natural hydrophilic polymers. Representative examples of such hydrophilic polymers include gum arabic, gelatin, gelatin derivatives such as phthalated gelatins, cellulose derivatives such as hydroxy cellulose, carboxymethyl cellulose and the like, soluble starches such as dextrin and combinations thereof. One class of hydrophilic polymers particularly useful in the invention is chemically modified gelatin. Specific examples of chemically modified gelatins include Gelita polymers from Kind & Knox and, more particularly, Gelita 8104, 8105, 8106 and 8107. These polymers are modified from Type A or Type B gelatin.

To initiate the process of the present invention, an aqueous phase is provided. The aqueous phase serves as the continuous phase of an oil-in-water emulsion in which the oily core materials phase is dispersed.

The aqueous phase preferably includes agents known as emulsifiers and system modifiers to control the size and uniformity of the microcapsules and to produce individual mononuclear capsules in preference to clusters of microcapsules. Useful emulsifiers and system modifiers are well known in the art. Their selection will depend on the type of microencapsulation process used and the nature of the wall formers. For making melamine-formaldehyde microcapsules a combination of methylated polygalacturonic acid and sulfonated polystyrenes is preferred. The polygalacturonic acid acts as both a stabilizer and a viscosity modifier for the aqueous phase, and the sulfonated polystyrenes aid in emulsification.

Methylated polygalacturonic acids having a methylation degree greater than 50% are generally available. The preferred polygalacturonic acids have a methylation degree between 40 and 70% and still more preferably between 55 and 65%. However, acids having a methylation degree less than 40% or greater than 70% are also believed to be useful.

The most typical example of useful acids are commonly known as pectins. Since pectin is a naturally occurring product, its composition will vary with the season and the source from which it is derived. As a result of this variation, some pectins will provide better microcapsules than others. Methylated polygalacturonic acid, when present, is generally added to the aqueous phase in an amount of about 1.0 to 8% based on the amount of water in the aqueous phase, with the preferred amount being about 2 to 4%. In a preferred embodiment of the present invention, a hydrophilic polymer is added to the aqueous phase. The hydrophilic polymer can be added in addition to the polygalacturonic acid or in full or partial substitution for the acid. Preferably, some quantity of hydrophilic polymer is substituted for the acid to improve consistency and repeatability of the microcapsule production process and also to minimize gelling with zincated developers.

Typical examples of sulfonated polystyrenes useful in the present invention are Versa TL500 and Versa TL503, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000–1,000,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystyrenes are better than others.

The operational center of the imaging system of the present invention is the encapsulate or internal phase of the coating composition and optionally a chromogenic material. In accordance with the invention, the internal phase comprises a polyvalent isocyanate and a photosensitive composition.

The internal phase preferably includes a diisocyanate or polyisocyanate compound which functions as a pre-wall reactant. As is known in the art, the polyisocyanate compound is capable of reacting with the water from the aqueous phase by polycondensation to form a thin layer of a polyurea polymer around the internal phase. A particularly preferred polyisocyanate is Desmodur N-100, a biuret of hexamethylene diisocyanate and water available from Mobay Chemical Company. Other isocyanates, such as SF-50, manufactured by Union Carbide may be used in this invention. The polyisocyanate is typically added in an amount of about 2 to 15 parts per 100 parts of internal phase.

Typically, the photosensitive composition includes a photoinitiator and a substance which undergoes a change in viscosity upon exposure to light in the presence of the photoinitiator. That substance may be a monomer, dimer, or oligomer which is polymerized to a higher molecular weight compound or it may be a polymer which is cross-linked. Alternatively, it may be a compound which is depolymerized or otherwise decomposed upon exposure.

Typically, the substance which undergoes a change in viscosity is a free radical addition polymerizable or crosslinkable compound. The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethylene glycol dimethacrylate.

Another radiation curable substance is an acrylate prepolymer derived from the partial reaction of pentaerythritol with acrylic acid or acrylic acid esters. Radiation curable compositions based on such prepolymers having an acrylate functionality of between approximately two and three are available commercially in two-package system radiation curable compositions from the Richardson Company, Melrose Park, Ill., such as RL-1482 and RL-1483 which are recommended to be mixed together to form a radiation curable clear varnish in a ratio of 4.4 parts of RL-1482 to 1 part RL-1483. Another class of curable materials useful in the present invention are found in radiation curable inks as the photosensitive component such as a mixture of a pentaerythritol acrylate and halogenated aromatic, alicyclic or aliphatic photoinitiator as disclosed in U.S. Pat. Nos. 3,661,614 to Bessemir et al, which is also incorporated by reference. Another type of radiation curable materials are halogenated resins which can be cross-linked upon exposure to ultraviolet radiation.

Some typical examples of radiation de-polymerizable materials useful in other embodiments of the invention are 3-oximino-2-butanone methacrylate which undergoes main chain scission upon ultraviolet exposure and poly (4'-alkyl acylo-phenones). See Reichmanis, E.; Am. Chem. Soc. Div. Org. Coat. Plast. Chem. Prepr. 1980, 43, 243–251 and Lukac, I.; Chmela S.., Int. Conf. on Modif. Polym. 5th Bratislava, Czech, Jul. 3–6, I.U.P.A.C. Oxford, England, 1979, 1, 176–182.

The radiation curable or depolymerizable material usually makes up the majority of the internal phase. A radiation curable material must be present in an amount sufficient to immobilize the chromogenic material upon exposure. With a depolymerizable material, on the other hand, the internal phase must be constituted such that the chromogenic material is immobilized prior to exposure but is released after exposure and capsule rupture. Typically these materials constitute 40 to 99 wt % of the internal phase (based on the weight of the oil solution containing the chromogen, the photosensitive composition and the carrier oil when present). In some embodiments, it has been found desirable to dilute the photosensitive composition with a carrier oil to improve half-tone gradation. In these cases a carrier oil is present in the amounts disclosed below and the aforesaid materials make up to 40 wt % of the internal phase.

The chromogenic materials used in the present invention are those chromogenic materials conventionally used in carbonless paper. In general, these materials are colorless electron donating type dry precursor compounds which react with a developer compound to generate a dye. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl) phthalide, 3-(p-dimethylaminophenyl)-3-(1,2-dimethylindole-3-yl)phthalide, 3-(p-dimethylaminophenyl)-3-(2-methylindole-3-yl)phthalide, 3-(p-dimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl) 6-dimethylaminophthalide, 3,3-bis-(9-ethylcarbazole-3-yl)-5-dimethylaminophthalide, 3,3-bis(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine(p-nitroanilino) lactam, Rhodamine-B-(p-chloroanilino)lactam, 3-dimethylamino-6-methoxyfluoran, 3-diethylamino-7-methoxyfluoran, 3-diethylamino-7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-(diethylamino)fluoran, 3-methyl-spiro-dinaphthopyran, 3,3'-dichloro-spiro-dinaphthopyran, 3-benzyl-spirodinaphthopyran, 3-methyl-naphtho-(3-methoxybenzo)-spiropyran, 3-propyl-spirodibenzoidipyran, etc. Mixtures of these color precursors can be used if desired. Also useful in the present invention are the fluoran color formers disclosed in U.S. Pat. No. 3,920,510, which is incorporated by reference. In addition to the foregoing dye precursors, fluoran compounds such as disclosed in U.S. Pat. No. 3,920,510 can be used. In addition, organic compounds capable of reacting with heavy metal salts to give colored metal complexes, chelates or salts can be adapted for use in the present invention.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen. A preferred range is from about 2 percent to about 7 percent. The amount of the chromogenic material required to obtain suitable images depends on the nature of the chromogen, the nature of the internal phase, and the type of imaging system. Typically less chromogenic material is used in the internal phase of a self-contained imaging system in comparison to a transfer system. This is because the developer material is co-deposited on a common substrate with the chromogenic encapsulate and there is a tendency for the chromogenic material to diffuse through the capsule wall and react with the developer material during storage and because there is no inherent loss in transfer. One means of preventing undesired coloration in a self-contained sheet is to reduce the amount of the chromogenic material in the internal phase. Another means is to incorporate color suppressants with the chromogenic material.

In addition to the chromogenic material, the photosensitive material, and the hydrophilic polymer, the internal phase of the present invention may also include a carrier oil to affect and control the tonal quality of the images obtained. While tonal quality (half-tone gradation) is not critical when copying printed documents, it is an important factor in faithfully reproducing pictorial images. Initial studies show that where trimethylol propane triacrylate is used in the radiation curable material, 20% of a carrier oil such as brominated paraffin improves tonal qualities. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, caster oil, mineral oil, deodorized kerosense, naphthenic mineral oils, dibutyl phthalate, dibutyl fumerate, brominated paraffin and mixtures thereof. Alkylated biphenyls are generally preferred.

Various photoinitiators can be selected for use in the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used in the present invention. If the system relies upon ionic polymerization to tie up the chromogen, the initiator may be the anion or cation generating type depending on the nature of the polymerization. Where, for example, ultraviolet sensitivity is desired, as in the case of direct transmission imaging using ultraviolet light, suitable photoinitiators include α-alkoxy phenyl ketones, O-acylated-α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers. Specific photoinitiators useful in the present invention include: α-alkoxyketone, α,α-dialkoxyketone, benzophenone, xanthane, chloroxanthanone, chloromethylxanthanone, chlorosulfoxylxanthanone, thioxanthanone, chloroxanthanone, chloromethylthioxanthanone, chlorosulforyl thioxanthanone, chloromethylnaphthalene, chlorosulfonyl naphthalene, chloromethyl anthracene, chlorosulfonyl anthracene, chloromethyl benzoxazole, chloromethyl benzothiazole, chloromethyl benzimidazole, chlorosulfonyl benzoxazole, chlorosulfonyl benzothiazole, chlorosulfonyl benzimidazole, a chloromethyl quinoline, a chlorosulfonyl quinoline, a chloromethyl benzophenone, a chlorosulfonyl benzophenone, a chloromethyl fluorenone, a chlorosulfony fluorenone, carbon tetrabromide, benzoin methyl ether, benzoin ethyl ether, desyl chloride, desyl amine, methylene blue/ascorbic acid, chlorinated aliphatic hydrocarbons and combinations thereof. The sensitivity among these compounds can be shifted by adding substituents such that the compounds generate radicals when exposed to the desired radiation wavelength.

The photoinitiator is present in the internal phase in an amount sufficient to initiate polymerization or cross-linking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition.

Particularly useful as photoinitators in the present invention are cationic dye-borate anion complexes as disclosed in commonly assigned U.S. Pat. Nos. 5,112,752; 5,100,755; 5,057,393; 4,865,942; 4,842,980; 4,800,149; 4,772,530 and 4,772,541 which are incorporated herein by reference. When employed as a photoinitiator in the present invention, the cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight. While the cationic dye-borate anion complex can be used alone as the initiator, film speeds tend to be quite low and oxygen inhibition is observed.

It has been found that it is preferable to use the complex in combination with an autoxidizer. An autoxidizer is a compound which is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para- position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), ace tylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N,N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N, N-dimethylaniline, 4-methyl-N,Ndimethylaniline, 4-ethoxy-N,N-dimethylaniline, N,N-dimethylaniline, N,N-dimethylthioanicidine, 4-amino-N,N-dimethylaniline, 3-hydroxy-N,N-dimethylaniline, N,N,N',N'-tetramethyl-1, 4-dianiline, 4-acetamido-N,N-dimethylaniline, 2,6-diisopropyl-N,N-dimethylaniline (DIDMA), 2,6-diethyl-N, N-dimethylaniline, N,N, 2,4,6-pentamethylaniline (PMA) and p-t-butyl-N,N-dimethylaniline. In accordance with one aspect of the invention, the photohardenable compositions used in the microcapsules contain a dye borate photoinitiator and a disulfide coinitiator. Examples of useful disulfides are described in U.S. Pat. No. 5,230,982.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napthalate, zinc 3,5di-tert butyl salicylate, zinc 3,5-di-(a-methylbenzyl) salicylate, oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns. A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition.

A preferred developer material is one which has excellent compatibility with the microcapsule slurry solution. Many materials, including zinc salicylate and some phenolic resin preparations, have marginal or poor compatibility with the MF microcapsule preparation and result in agglomeration which is believed to be due to an incompatibility in the emulsifiers used in preparing the microcapsules and in the developer. The problem manifests itself in increasing solution viscosities or in instability of the microcapsules wall (or both). The microcapsules may become completely disrupted with a complete breakdown or disintegration of the wall. The problem is believed to be caused by the presence of water soluble acid salts in the developer solution. By modifying the acidic salts to make them water insoluble the developer material becomes compatible with the MF microcapsules. Preferred developers, which have good stability include phenolic resins from Schenectady International, such as HRJ-4250 and HRJ-4542. In accordance with the present invention, incompatibility problems can be alleviated by substituting hydrophilic polymers for some or all of the polygalacturonic acid or other emulsifier.

In accordance with the present invention, the preferred method for encapsulating the internal phase is by coacervation of a hydrophilic polymer around droplets of an oily internal phase solution. The capsules formed are further hardened by enwrapping them in an amine-formaldehyde precondensate. Complex coacervation is a well known technique for microencapsulating a hydrophobic oil solution (see U.S. Pat. No. 2,800,457 to Green et al.). Methods for forming microcapsule walls by in situ condensation of formaldehyde and an amine are also known and are described in U.S. Pat. Nos. 4,001,140; 4,087,376 and 4,089, 802 to Forris et al. and U.S. Pat. No. 4,025,455 to Shackle. To the extent necessary for complete disclosure of those wall-forming processes, the above mentioned patents are specifically incorporated by reference.

The capsule forming material used in a given imaging system is selected based on the photosensitive composition present in the encapsulate. Thus, the formed capsule wall must be transmissive to the exposure radiation. Of the above systems melamine-formaldehyde capsules are preferred.

The mean size of the capsules used in the present invention may vary over a broad range but generally ranges from approximately 1 to 25microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 3 to 15 microns and particularly approximately 3 to 10 microns.

The improved imaging system of the invention may be embodied in a self-contained copy sheet in which the encapsulated chromogenic material and the developer material are co-deposited on one surface of a single substrate as one layer or as two interactive layers or they are deposited on two supports in layers which can interact when the supports are juxtaposed; or it may be embodied in a transfer system in which the developer material is coated on a separate substrate as a separate developer or copy sheet. Both systems operate by photographic control of the access between the chromogenic material and the developer as previously described. In the self-contained imaging system, following capsule rupture, the chromogenic material and the developer are able to react to form a visible image in the exposed or the unexposed areas (depending on whether the photosensitive composition is photohardened or photosoftened). Gradual development of the visible image is observed following exposure and capsule rupture as the chromogenic material and developer migrate, mix and react on the face of the sheet.

Typically, capsule rupture is effected by the application of pressure to the imaging sheet alone (in the case of a self-contained system) or in contact with a developer sheet (in a transfer system using pressure rollers or a roller ball). Alternative means of capsule rupture can also be used. For example, systems are envisioned in which the capsules are ruptured ultrasonically, thermally, or by solvent.

In a preferred embodiment of the invention, the imaging system is a sealed self-contained imaging system. This sealed format is advantageous because it prevents the developer material and the chemicals in the microcapsules from contacting persons during handling and, depending on the nature of the supports, it also may prevent oxygen from permeating into the photohardenable material which may improve film speed and the stability of the image. The term "sealed" as used herein refers to a seal which is designed as a nontemporary seal which results in destruction of the imaging assembly if the seal is broken.

The peripheral edges of the self-contained assembly may be sealed additionally by any of the conventional means used to seal polymeric materials such as polyethylene terephthalate. For example, the edges of the films can be heat sealed together or they can be sealed by any other technique. In one embodiment, the PET is sealed using a heat sealing method such as a heat knife.

The invention is illustrated in more detail by the following non-limiting examples.

EXAMPLE 1

Microencapsulation with gelatine in the oil phase
Model Laboratory Capsule Preparation 1. Into a stainless steel beaker, 110 g water and 4.6 g dry sodium salt of polyvinylbenzenesulfonic acid (VERSA) are weighed.

2. The beaker is clamped in place on a hot plate under an overhead mixer. A six-bladed, 45° pitch, turbine impeller is used on the mixer.

3. After thoroughly mixing, 4.0 g pectin (polygalacturonic acid methyl ester) is slowly sifted into the beaker. This mixture is stirred for 2 hours at room temperature (800–1200 rpm).

4. The pH is adjusted to 6.0 with 2% sodium hydroxide.

5. The mixer is turned up to 3000 rpm and the internal phase is added over a period of 10–15 seconds. Emulsification is continued for 10 minutes. Magenta and yellow precursor phases are emulsified at 25°–30° C.; Cyan phase is emulsified at 45°–50° C. (oil), 25°–30° C. (water).

6. At the start of emulsification, the hot plate is turned up so heating continues during emulsification.

7. After 20 minutes, the mixing speed is reduced to 2000 rpm, and a solution of melamine-formaldehyde prepolymer is slowly added. This prepolymer is prepared by adding 6.5 g formaldehyde solution (37%) to a dispersion of 3.9 g melamine in 44 g water. After stirring at room temperature for 1 hour the pH is adjusted to 8.5 with 5% sodium carbonate and then heated to 62° C. until the solution becomes clear (30 minutes).

8. The pH is adjusted to 6.0, using 5% phosphoric acid. The beaker is then covered with foil and placed in a water bath to bring the temperature of the preparation to 75° C. When 75° C. is reached, the hot plate is adjusted to maintain this temperature for a two hour cure time during which the capsule walls are formed.

9. After curing, mixing speed is reduced to 1800 rpm, formaldehyde scavenger solution (7.7 g urea and 7.0 g water) is added and the solution cured another 40 minutes.

10. After 40 minutes hold time, turn down the mixer rpm to 1100 and adjust the pH to 9.5 using a 20% NaOH solution and then allow to stir at 500 rpm overnight at room temperature.

Three batches of microcapsules are prepared as above for use in a full color imaging sheet using the three internal phase compositions set forth below.

| Yellow Capsule Internal Phase (420 nm) | |
| --- | --- |
| TMPTA | 163.6 g |
| Gelatine Pellets | 0.25–5 g |
| Photoinitiator | 0.80 g |
| 2-Mercaptobenzothiazole (MBT) | 0.55 g |
| 2,6-Diisopropyldimethylaniline (DIDMA) | 0.82 g |
| CP 269 (Yellow dye precursor from Hilton Davis) | 16.0 g |
| Desmodur N-100 (Bayer Biuret Polyisocyanate Resins) | 13.09 g |
| Magenta Capsule Internal Phase (550 nm) | |
| TMPTA | 147.3 g |
| DPHPA | 16.3 g |
| Gelatine Pellets | 0.25–5 g |
| Photoinitiator | 0.47 g |
| 2-Mercaptobenzothiazole (MBT) | 0.55 g |
| 2,6-Diisopropyldimethylaniline | 1.09 g |
| CP164 (Magenta color precursor from Hilton-Davis Chemical Co.) | 25.3 g |
| Desmodur N-100 (Bayer Biuret Polyisocyanate Resins) | 13.09 g |
| Cyan Capsule Internal Phase (650 nm) | |
| TMPTA | 114.50 g |
| DPHPA | 49.10 g |
| Gelatine Pellets | 0.25–5 g |
| Photoinitiator | 0.85 g |
| 2-Mercaptobenzothiazole (MBT) | 0.55 g |
| 2,6-Diisopropyldimethylaniline | 1.09 g |
| CP 270 (Cyan Precursor from Yamada Chemical Co. Jpn.) | 6 g |

Microcapsules prepared as above can be mixed in the following dry ratio as percentage to prepare the following coating composition (Cyliths):

| | |
| --- | --- |
| Cyan Capsules | 38% |
| Magenta Capsules | 32% |
| Yellow Capsules | 30% |

A typical coating composition can be coated on an opaque PET support (Melinex) at a dry coat weight of 17 g/sq m. Such composition comprises:

| | |
| --- | --- |
| Cyliths | 4.94 g (29 %) |
| Phenolic Resin (HRJ 4542 from Schenectady Chemical Co.) | 11.54 g (68%) |
| Polyvinyl alcohol (airvol grade 205 from Air Products Co.) | 0.26 g (1.5%) |
| Sequrez 755 (binder) | 0.26 g (1.5%) |

EXAMPLE 2

Microencapsulation with gelatine in the aqueous phase
Model Laboratory Capsule Preparation 1. Into a stainless steel beaker, 110 g water and 4.6 g dry sodium salt of polyvinylbenzenesulfonic acid (VERSA) are weighed.

2. The beaker is clamped in place on a hot plate under an overhead mixer. A six-bladed, 45° pitch, turbine impeller is used on the mixer.

3. After thoroughly mixing, 4.0 g pectin (polygalacturonic acid methyl ester) is slowly sifted into the beaker.

4. 0.25–5.0 g gelatin (pellets or solution thereof) is added to the beaker containing pectin/versa with continuous stirring. This mixture is stirred for 2 hours at room temperature (800–1200 rpm).

5. The pH is adjusted to 6.0 with 2% sodium hydroxide.

6. The mixer is turned up to 3000 rpm and the internal phase is added over a period of 10–15 seconds. Emulsification is continued for 10 minutes. Magenta and yellow precursor phases are emulsified at 25°–30° C.; Cyan phase is emulsified at 45°–50° C. (oil), 25°–30° C. (water).

7. At the start of emulsification, the hot plate is turned up so heating continues during emulsification.

8. After 20 minutes, the mixing speed is reduced to 2000 rpm, and a solution of melamine-formaldehyde prepolymer is slowly added. This prepolymer is prepared by adding 6.5 g formaldehyde solution (37%) to a dispersion of 3.9 g melamine in 44 g water. After stirring at room temperature for 1 hour the pH is adjusted to 8.5 with 5% sodium carbonate and then heated to 62° C. until the solution becomes clear (30 minutes).

9. The pH is adjusted to 6.0, using 5% phosphoric acid. The beaker is then covered with foil and placed in a water bath to bring the temperature of the preparation to 75° C. When 75° C. is reached, the hot plate is adjusted to maintain this temperature for a two hour cure time during which the capsule walls are formed.

10. After curing, mixing speed is reduced to 1800 rpm, formaldehyde scavenger solution (7.7 g urea and 7.0 g water) is added and the solution cured another 40 minutes.

11. After 40 minutes hold time, turn down the mixer rpm to 1100 and adjust the pH to 9.5 using a 20% NaOH solution and then allow to stir at 500 rpm overnight at room temperature.

Three batches of microcapsules are prepared as above for use in a full color imaging sheet using the three internal phase compositions set forth below.

| Yellow Capsule Internal Phase (420 nm) | |
|---|---|
| TMPTA | 163.6 g |
| Photoinitiator | 0.80 g |
| 2-Mercaptobenzothiazole (MBT) | 0.55 g |
| 2,6-Diisopropyldimethylaniline (DIDMA) | 0.82 g |
| CP 269 (Yellow dye precursor from Hilton Davis) | 16.0 g |
| Desmodur N-100 (Bayer Biuret Polyisocyanate Resins) | 13.09 g |
| Magenta Capsule Internal Phase (550 nm) | |
| TMPTA | 147.3 g |
| DPHPA | 16.3 g |
| Photoinitiator | 0.47 g |
| 2-Mercaptobenzothiazole (MBT) | 0.55 g |
| 2,6-Diisopropyldimethylaniline | 1.09 g |
| CP164 (Magenta color precursor from Hilton-Davis Chemical Co.) | 25.3 g |
| Desmodur N-100 (Bayer Biuret Polyisocyanate Resins) | 13.09 g |
| Cyan Capsule Internal Phase (650 nm) | |
| TMPTA | 114.50 g |
| DPHPA | 49.10 g |
| Photoinitiator | 0.85 g |
| 2-Mercaptobenzothiazole (MBT) | 0.55 g |
| 2,6-Diisopropyldimethylaniline | 1.09 g |
| CP 270 (Cyan Precursor from Yamada Chemical Co. Jpn.) | 6 g |

Microcapsules prepared as above can be mixed in the following dry ratio as percentage to prepare the following coating composition (Cyliths):

| Cyan Capsules | 38% |
|---|---|
| Magenta Capsules | 32% |
| Yellow Capsules | 30% |

A typical coating composition can be coated on an opaque PET support (Melinex) at a dry coat weight of 17 g/sq m. Such composition comprises:

| Cyliths | 4.94 g (29 %) |
|---|---|
| Phenolic Resin (HRJ 4542 from Schenectady Chemical Co.) | 11.54 g (68%) |
| Polyvinyl alcohol (airvol grade 205 from Air Products Co.) | 0.26 g (1.5%) |
| Sequrez 755 (binder) | 0.26 g (1.5%) |

Having described the invention in detail and by reference to preferred embodiments thereof, it will be apparent that modifications and variations are possible without departing from the scope of the invention defined in the appended claims.

What is claimed is:

1. A process for forming microcapsules having substantially impermeable microcapsule walls comprising the steps of:
   forming an emulsion of an internal phase in a continuous aqueous phase, said internal phase including a photosensitive composition and a polyvalent isocyanate, said continuous aqueous phase including a sulfonated polystyrene, a polygalacturonic acid and an additional hydrophilic polymer; and
   enwrapping particles of said internal phase in an amine-formaldehyde condensation product produced by in situ condensation of an amine and formaldehyde,
   whereby said hydrophilic polymer becomes incorporated into said microcapsule walls thereby improving humidity stability of said microcapsules.

2. The process according to claim 1 wherein said polygalacturonic acid is pectin.

3. The process of claim 1 wherein said hydrophilic polymer is selected from the group consisting of gelatin, gelatin derivatives, gum arabic, starch, cellulose derivatives and combinations thereof.

4. The process of claim 3 wherein said hydrophilic polymer is gelatin.

5. The process of claim 1 wherein said amine is urea or melamine.

6. The process of claim 1 wherein said photosensitive composition is a photopolymerizable composition.

7. The process of claim 6 wherein said photopolymerizable composition contains an ethylenically unsaturated compound.

8. Process for forming photosensitive amine-formaldehyde microcapsules having substantially impermeable walls comprising the steps of:
   emulsifying a photosensitive hydrophobic oil containing a polyvalent isocyanate in a continuous aqueous phase containing a sulfonated polystyrene, a polygalacturonic acid and a hydrophilic polymer selected from the group consisting of gelatine, gum arabic, starch, cellulose and combinations thereof, wherein said polyvalent isocyanate reacts with water of said aqueous phase to form a substantially impermeable pre-wall around droplets of said hydrophobic oil; and enwrapping the pre-wall coated droplets of said hydrophobic oil in an amineformaldehyde condensation product produced by in situ condensation of an amine and formaldehyde, wherein said hydrophilic polymer is incorporated into said microcapsule walls thereby improving the humidity stability of said microcapsules.

9. The process of claim 8 wherein said amine is melamine.

10. The process of claim 8 wherein said hydrophilic polymer is gelatin.

11. The process of claim 8 wherein said polygalacturonic acid is pectin.

12. The process of claim 8 wherein said photosensitive hydrophobic oil comprises a monomer and said hydrophilic polymer is present in said aqueous phase in an amount of about 0.01 to 10% by weight based on said monomer.

13. The process of claim 12 wherein said hydrophilic polymer is present in said aqueous phase in an amount of about 0.15 to 3% by weight based on said monomer.

14. The process of claim 13 wherein said hydrophilic polymer comprises gelatin.

* * * * *